United States Patent
Park et al.

(10) Patent No.: US 10,402,528 B2
(45) Date of Patent: Sep. 3, 2019

(54) METHODS, SYSTEMS, AND COMPUTER PROGRAM PRODUCTS FOR GENERATING SEMICONDUCTOR CIRCUIT LAYOUTS

(71) Applicant: Samsung Electronics Co., Ltd., Suwon-Si, Gyeonggi-do (KR)

(72) Inventors: Chul-Hong Park, Seongnam-si (KR); Su-Hyeon Kim, Bucheon-si (KR); Sharma Deepak, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 755 days.

(21) Appl. No.: 14/966,264

(22) Filed: Dec. 11, 2015

(65) Prior Publication Data
US 2016/0180002 A1     Jun. 23, 2016

(30) Foreign Application Priority Data
Dec. 18, 2014  (KR) .................. 10-2014-0183059

(51) Int. Cl.
*G06F 17/50* (2006.01)
(52) U.S. Cl.
CPC ...... *G06F 17/5072* (2013.01); *G06F 17/5081* (2013.01)

(58) Field of Classification Search
CPC .................. G06F 17/5072; G06F 17/5081
USPC ......................................... 716/111
See application file for complete search history.

(56) References Cited

U.S. PATENT DOCUMENTS

| | | | | |
|---|---|---|---|---|
| 7,785,946 B2* | 8/2010 | Haffner | ............ | H01L 21/28123 438/183 |
| 8,490,043 B2* | 7/2013 | Gupta | ............ | G06F 17/5063 430/30 |
| 8,627,240 B1* | 1/2014 | Acar | ............ | G06F 17/5081 385/14 |
| 9,405,879 B2* | 8/2016 | Wang | ............ | G06F 17/5081 |

* cited by examiner

*Primary Examiner* — Jack Chiang
*Assistant Examiner* — Brandon Bowers
(74) *Attorney, Agent, or Firm* — Muir Patent Law, PLLC

(57) ABSTRACT

A method of generating electronic circuit layout data can include electronically providing data representing a first standard cell layout including a first scaling enhanced circuit layout in an electronic storage medium. The first scaling enhanced circuit layout included in the first standard cell layout can be electronically defined using a marker layer. The first scaling enhanced circuit layout can be electronically swapped for a second scaling enhanced circuit layout to electronically generate data representing a second standard cell layout in the electronic storage medium. The data representing the second standard cell layout can be electronically verified.

14 Claims, 17 Drawing Sheets

(a)

(b)

METHODS, SYSTEMS, AND COMPUTER PROGRAM PRODUCTS FOR GENERATING SEMICONDUCTOR CIRCUIT LAYOUTS

CROSS-REFERENCE TO RELATED APPLICATION

This application claims priority from Korean Patent Application No. 10-2014-0183059 filed on Dec. 18, 2014, in the Korean Intellectual Property Office, and all the benefits accruing therefrom under 35 U.S.C. 119, the contents of which are incorporated herein by reference in their entirety.

BACKGROUND

1. Technical Field

The present inventive concept relates to a method of designing a semiconductor device and a system for designing the semiconductor device.

2. Description of the Related Art

A semiconductor device can be fabricated by patterning various devices and interconnections thereof on a substrate, such as a semiconductor wafer. The semiconductor device may be fabricated by designing integrated circuits using electronic design automation (EDA) tools and techniques. In particular, a semiconductor device layout may be generated using EDA tools in which various components of a circuit are functionally positioned and connected to each other by a designer.

The semiconductor device layout can be transferred to a semiconductor substrate, thereby fabricating the semiconductor device. However, before the layout is completed, the semiconductor device layout may be subjected to a verification process. The semiconductor device layout includes various physical positions and sizes of circuit components, connecting wires, and various layers. The verification process of the semiconductor device layout can be accomplished by checking whether the layout is in conformity with the design rule. However, if the layout completely being in conformity with the design rule is generated, there may be a limit to reducing the scale of the semiconductor device.

SUMMARY

Embodiments according to the inventive concept, can provide methods, systems, and computer program products for generating semiconductor circuit layouts. Pursuant to these embodiments, a method of generating electronic circuit layout data can include electronically providing data representing a first standard cell layout including a first scaling enhanced circuit layout in an electronic storage medium. The first scaling enhanced circuit layout included in the first standard cell layout can be electronically defined using a marker layer. The first scaling enhanced circuit layout can be electronically swapped for a second scaling enhanced circuit layout to electronically generate data representing a second standard cell layout in the electronic storage medium. The data representing the second standard cell layout can be electronically verified.

In some embodiments according to the inventive concept, a method of generating electronic circuit layout data can include electronically providing data representing a second scaling enhanced circuit layout including a design rule violation layer in an electronic storage medium. Data representing a first standard cell layout including a first scaling enhanced circuit layout can be electronically provided that is different from the second scaling enhanced circuit layout and including a design rule violation layer in the electronic storage medium. The first scaling enhanced circuit layout can be electronically swapped for the second scaling enhanced circuit layout to electronically generate a second standard cell layout and the second standard cell layout can be electronically verified.

In some embodiments according to the inventive concept, a system of generating electronic circuit layout data, the system can include a processor circuit and an electronic storage medium that is configured to store an update module executed by the processor circuit, wherein the update module can be configured to receive data representing a first standard cell layout including a first scaling enhanced circuit layout, and can be configured to define the first scaling enhanced circuit layout included in the first standard cell layout using a marker layer, and can be configured to swap the first scaling enhanced circuit layout for a second scaling enhanced circuit layout to provide data representing a second standard cell layout.

In some embodiments according to the inventive concept, a system for designing a semiconductor device can include a processor circuit and an electronic storage medium that is configured to store a data file uploaded or downloaded using the processor circuit, wherein the data file includes data representing a standard cell layout and data representing a scaling enhanced circuit layout corresponding to the standard cell layout and including a design rule violation layer.

In some embodiments according to the inventive concept, a computer program product, can include a tangible computer readable storage medium comprising computer readable program code embodied in the medium that when executed by a processor circuit causes the processor circuit to perform operations including allowing an electronic design automation tool access to data representing a first standard cell layout including a first scaling enhanced circuit layout in an electronic storage medium and allowing the electronic design automation tool to replace the first scaling enhanced circuit layout with a second scaling enhanced circuit layout to provide data representing a second standard cell layout in the electronic storage medium.

BRIEF DESCRIPTION OF THE DRAWINGS

FIGS. 6B to 8 are diagrams illustrating processes illustrated in FIG. 1;

DESCRIPTION OF THE EMBODIMENTS ACCORDING TO THE INVENTIVE CONCEPT

Figure 1:
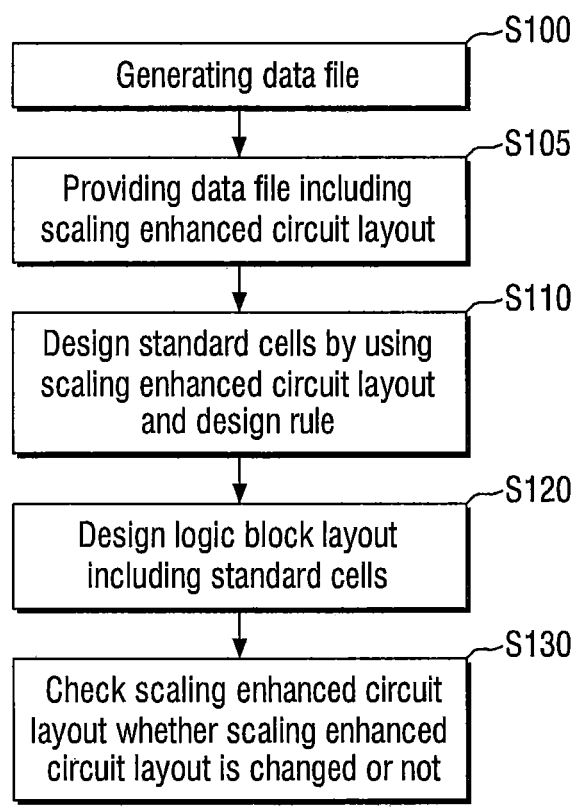
FIG. 1 is a flowchart illustrating a method of processing a semiconductor device design according to an embodiment of the present inventive concept.

The present inventive concept will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions may be exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Aspects of the present disclosure may be illustrated and described herein in any of a number of patentable classes or contexts including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "circuit," "module," "component," or "system." Furthermore, aspects of the present disclosure may take the form of a computer program product comprising one or more computer readable media having computer readable program code embodied thereon.

Any combination of one or more computer readable media may be used. The computer readable media may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an appropriate optical fiber with a repeater, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB.NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods, and computer program products according to various aspects of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Hereinafter, a method of designing a semiconductor device according to an embodiment of the present inventive concept will be described with reference to FIGS. 1 to 8.

FIG. 1 is a flowchart illustrating a method of processing a semiconductor device design according to an embodiment of the present inventive concept.

Referring to FIG. 1, a data file is generated (S100). For example, a data file including a scaling enhanced circuit layout may be generated, which is described in more detail with reference to FIGS. 2 to 5.

Figure 2:
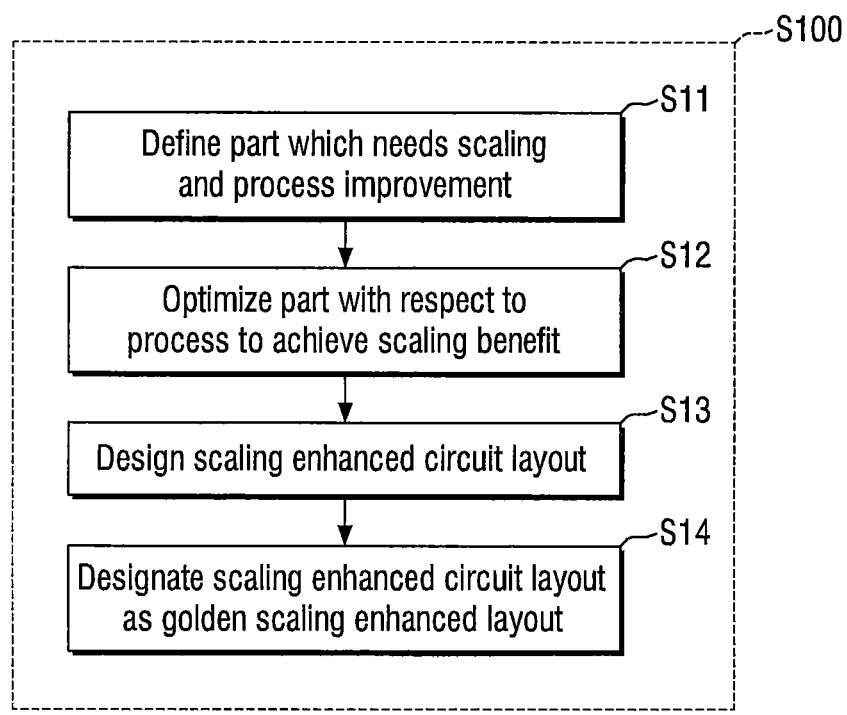
FIG. 2 is a detailed flowchart illustrating the step S100 of FIG. 1.

FIG. 2 is a detailed flowchart illustrating the step S100 of FIG. 1 and FIGS. 3 to 5 are diagrams illustrating the method illustrated in FIG. 2.

Figure 3:
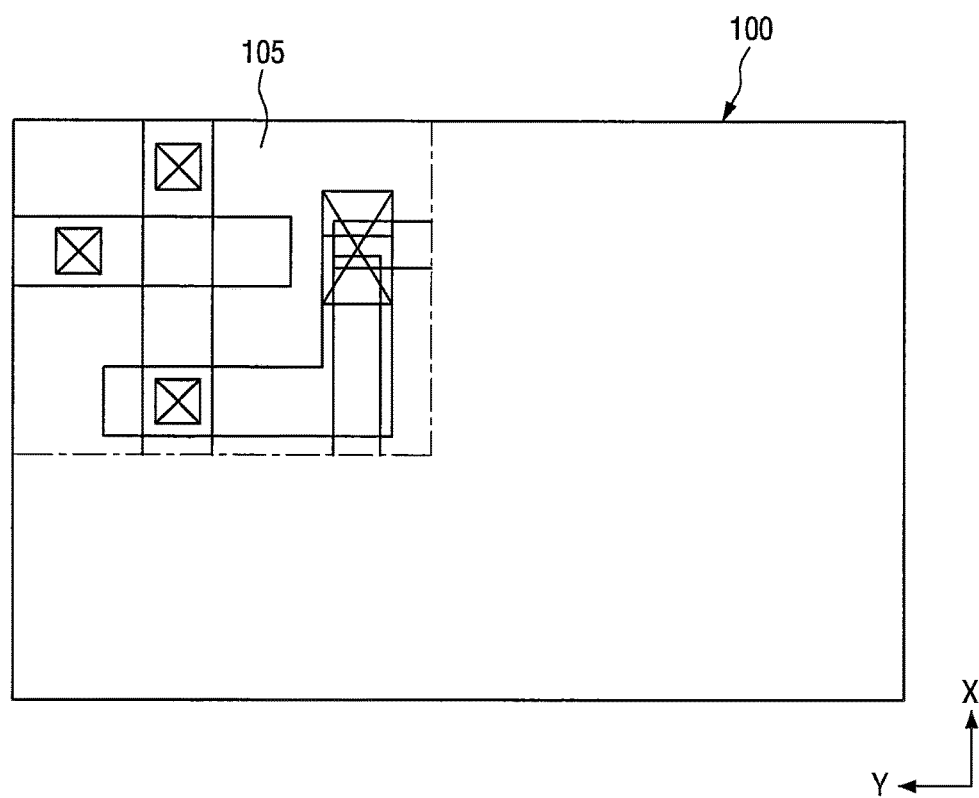
FIGS. 3, 4A, 4B, and 5 are diagrams illustrating the processing illustrated in FIG. 2.

Referring to FIGS. 2 and 3, part of a target standard cell 100 is defined as a design rule violation requiring region 105 (S11).

The target standard cell 100 may be a basic cell used in a logic circuit. That is to say, the target standard cell 100 may be a circuit component performing a particular function. For example, the target standard cell 100 may be a standard cell including an NAND circuit, a NOR circuit, an inverter circuit, a flip flop circuit, and the like, but aspects of the present disclosure are not limited thereto.

It will be understood that a design rule violation requiring region 105 may be part of a standard cell performing a particular function, but aspects of the present disclosure are not limited thereto. The embodiment of the present inventive concept may be modified such that the design rule violation requiring region 105 is defined as a region of the target standard cell 100 performing a particular function.

The design rule violation requiring region 105 may be part of a single standard cell but may be part of a variety of types of standard cells. That is to say, the part commonly included in the variety of types of standard cells may be defined as the design rule violation requiring region 105.

For example, the design rule violation requiring region 105 may be defined as part of the target standard cell 100, which needs scaling and process improvement. That is to say, the design rule violation requiring region 105 may be defined as part of a high process challenge with respect to fabrication process.

For example, when a cross-coupled configuration is implemented in a region of a given standard cell, it may be necessary to design a diagonal contact plug in the standard cell in consideration of a process margin. However, it may be difficult to describe such a complicated structure using the design rule. Alternatively, even if the complicated structure is described using the design rule, it may be quite difficult to form a layout having the same structure as intended by a designer of the design rule.

Therefore, part or a region, which is difficult to be described using the design rule, or which is difficult to form the same layout even if it is described using the design rule, may be defined as the design rule violation requiring region 105.

The design rule violation requiring region 105 illustrated in FIG. 3 is provided only for the sake of convenience and aspects of the present disclosure are not limited thereto.

Referring again to FIG. 2, in order to achieve a down-scaling benefit, the part defined as the design rule violation requiring region 105 is optimized with respect to process (S12).

That is to say, with respect to fabrication process, the layout of the design rule violation requiring region 105 may be optimized.

Here, it is not necessary to optimize layouts of all layers included in the design rule violation requiring region 105. That is to say, layouts of at least some of multiple layers included in the design rule violation requiring region 105 may be optimized with respect to process.

Therefore, a design rule violation layer may be designed by optimizing the processes for the at least some of multiple layers included in the design rule violation requiring region 105.

Next, referring to FIG. 2, a first scaling enhanced circuit layout 120 including the design rule violation layer is designed, the design rule violation layer being designed through process optimization (S13). As described above, the first scaling enhanced circuit layout 120 may be a layout obtained by optimizing the design rule violation requiring region 105 with respect to process.

Since the design rule violation requiring region 105 is part of the target standard cell 100, the first scaling enhanced circuit layout 120 designed based on the design rule violation requiring region 105 may also be part of the target standard cell layout. Therefore, the part formed based on the first scaling enhanced circuit layout 120 may not perform a particular function.

For the sake of convenience, the following description will be made assuming that the design rule violation requiring region 105 illustrated in FIG. 3 is a design rule violation layer optimized with respect to process. That is to say, it is assumed that the design rule violation layer and the first scaling enhanced circuit layout 120 correspond to one another. However, the present disclosure is not limited to the specific assumption disclosed herein. The design rule violation layer may be designed by optimizing only some of multiple layers included in the design rule violation requiring region 105.

Referring again to FIGS. 2, 4A, 4B, and 5, the first scaling enhanced circuit layout 120 is designated as a golden scaling enhanced layout 110 (S14). And, the designated golden scaling enhanced layout 110 may be registered.

In some embodiments of the present inventive concept, the first scaling enhanced circuit layout 120 and the golden scaling enhanced layout 110 may be substantially the same layout.

Figure 4A:
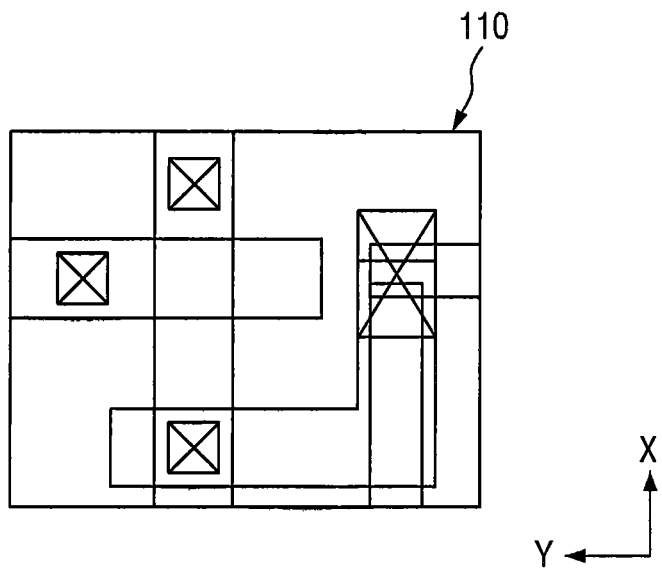
Figure 4B:
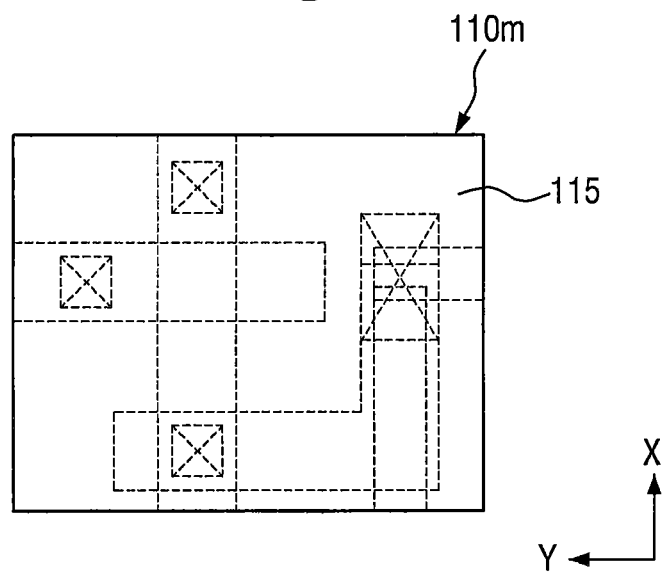

For example, the golden scaling enhanced layout 110 may include only a circuit layout, as illustrated in FIG. 4A, or may include a golden scaling enhanced layout 110m including a marker layer 115, as illustrated in FIG. 4B.

Figure 5:
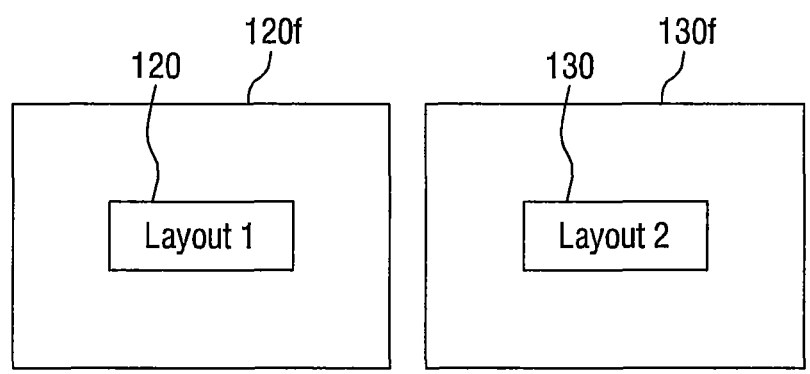

Next, as illustrated in FIG. 5, a first data file 120f including the first scaling enhanced circuit layout 120 is generated. The thus generated first data file 120f may be provided to another entity, for example, Entity B (60 of FIG. 6A), such as an IC designer.

The first scaling enhanced circuit layout 120 included in the first data file 120f may include the marker layer 115, as illustrated in FIG. 4B, but aspects of the present disclosure are not limited thereto.

The IC designer may design an IC according to the design rule, which may be disadvantageous from the viewpoint of scaling but may be advantageous from the viewpoint of IC achieving benefit.

In a case where the IC designer designs an IC layout contrary to the design rule, it is not certain whether the IC layout contrary to the design rule is to be implemented as an actual IC. That is to say, unless the IC layout contrary to the design rule is luckily implemented as an IC by the IC designer through process optimization, the IC layout should be redesigned.

Meanwhile, the IC designer may implement the IC layout contrary to the design rule as an actual IC by optimizing the process. That is to say, the IC designer can implement a complicated pattern contrary to the design rule by controlling process conditions.

In addition, when a photo mask is fabricated using an IC layout, the IC designer may utilize an optical proximity correction (OPC) method, for example. That is to say, the IC designer can implement a complicated pattern contrary to the design rule by controlling conditions of the process of forming the photo mask.

The IC designer designs an IC layout based on the design rule and implements an IC by optimizing the actual IC layout. Therefore, the IC designer may optimize an IC layout which is contrary to the design rule or a very complicated IC layout which is quite difficult to be described using the design rule, with respect to process, and may then form the same into a scaling enhanced circuit layout.

Therefore, designing a standard cell layout using the scaling enhanced circuit layout may considerably reduce the size of a standard cell, compared to a case of designing a standard cell layout according to the design rule.

In the illustrated embodiment, the method of designing one single golden scaling enhanced layout 110 illustrated in FIGS. 3 and 4 has been described, but aspects of the present disclosure are not limited thereto. That is to say, in the target standard cell 100, a region having a different structure from the design rule violation requiring region 105 may be defined as an additional design rule violation requiring region, for which a scaling enhanced circuit layout may be designed.

Alternatively, in another target standard cell, which is different from the target standard cell 100 illustrated in FIG. 3, a region having a different structure from the design rule violation requiring region 105 illustrated in FIG. 3 may be defined as an additional design rule violation requiring region, for which a scaling enhanced circuit layout may be designed.

Meanwhile, the second scaling enhanced circuit layout 130 included in a second data file 130f illustrated in FIG. 5 may be a layout designed by optimizing the process of the additional design rule violation requiring region.

Referring again to FIG. 1, a data file including a scaling enhanced circuit layout is provided (S105).

In detail, for example, as illustrated in FIG. 5, a first data file 120f and a second data file 130f are provided, the first data file 120f including a first scaling enhanced circuit layout (Layout 1) 120 and the second data file 130f including a second scaling enhanced circuit layout (Layout 2) 130 different from the first scaling enhanced circuit layout 120.

In some embodiments of the present inventive concept, a design rule manual including a design rule required for designing an IC may further be provided while being provided with the first data file 120f and the second data file 130f.

The design rule may include many variables provided by the IC designer. The IC designer may verify the accuracy of a photo mask set to be formed based on the IC layout by the design rule.

The design rule may include, for example, a ground rule and a special structure. Here, the special structure may mean a structure to which a margin is more strictly applied than the ground rule. That is to say, the special structure may also be a kind of the design rule.

The design rule may include, for example, a width rule, minimum area rule, a space rule, an enclosure rule, a symmetry rule, an alignment rule, and so on.

The design rule may be provided to the IC designer in a format of a file, for example.

Unlike the design rule, the first scaling enhanced circuit layout 120 and the second scaling enhanced circuit layout 130 may be provided to the IC designer in a format of a graphic file.

For example, the first data file 120f or the second data file 130f may be provided in a format of one of a graphic database system (GDS) file, a GDS instance file and a hard macro file, but aspects of the present disclosure are not limited thereto. That is to say, the first data file 120*f* or the second data file 130*f* may only represent a circuit layout in a graphic file format.

In other words, the first scaling enhanced circuit layout 120 and the second scaling enhanced circuit layout 130 may be provided to the IC designer in a format of one of a graphic database system (GDS) file, a GDS instance file and a hard macro file In some embodiments of the present inventive concept, the data files 120*f* and 130*f* may be provided from an IC designer to another IC designer through a predetermined system, which will now be described in more detail with reference to FIG. 6A.

Figure 6A:
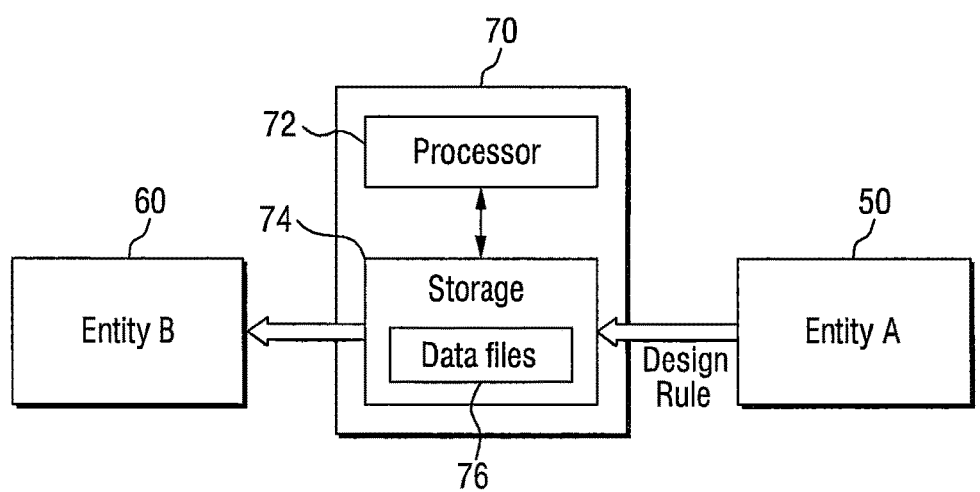
FIG. 6A is a block diagram of a system configured to process a semiconductor device design according to an embodiment of the present inventive concept.

FIG. 6A is a block diagram of a system configured to process a semiconductor device design according to an embodiment of the present inventive concept.

Referring to FIG. 6A, the designing system 70 may include a processor 72 and a storage 74.

Data files 76, provided from a first entity 50 (for example, an IC designer), may be stored in the storage 74. The first entity 50 may upload the first data file 120*f* including the first scaling enhanced circuit layout 120 and the second data file 130*f* including second scaling enhanced circuit layout 130 different from the first scaling enhanced circuit layout 120, designed by the above-described method, to the storage 74.

The data files 76 stored in the storage 74 may be provided to, for example, a second entity 60, such as an IC designer, through downloading. That is to say, the first data file 120*f* including the first scaling enhanced circuit layout 120 and the second data file 130*f* including the second scaling enhanced circuit layout 130 different from the first scaling enhanced circuit layout 120 may be provided to the second entity 60.

The processor 72 may be used in performing a predetermined operation of the system in the course of uploading or downloading a data file.

In some embodiments of the present inventive concept, the storage 74 may further store a design rule provided from the first entity 50 to the second entity 60. That is to say, the design rule may also be provided from the first entity 50 to the second entity 60 through the illustrated designing system 70.

In some embodiments of the present inventive concept, the designing system 70 may be implemented using, for example, a web interface, but aspects of the present disclosure are not limited thereto. The environment for implementing the designing system 70 may vary in many ways.

Referring back to FIG. 1, the layout of standard cells is designed by using the provided design rule and the scaling enhanced circuit layout (S110). Then logic block layout including the standard cells is designed (S120). Then, it is checked whether the scaling enhanced circuit layout included in the logic block layout is changed or not in designing the standard cell layout or designing the logic block layout (S130), which will now be described in more detail with reference to FIGS. 6B to 8.

FIGS. 6B to 8 are diagrams illustrating the method illustrated in FIG. 1.

Figure 6B:
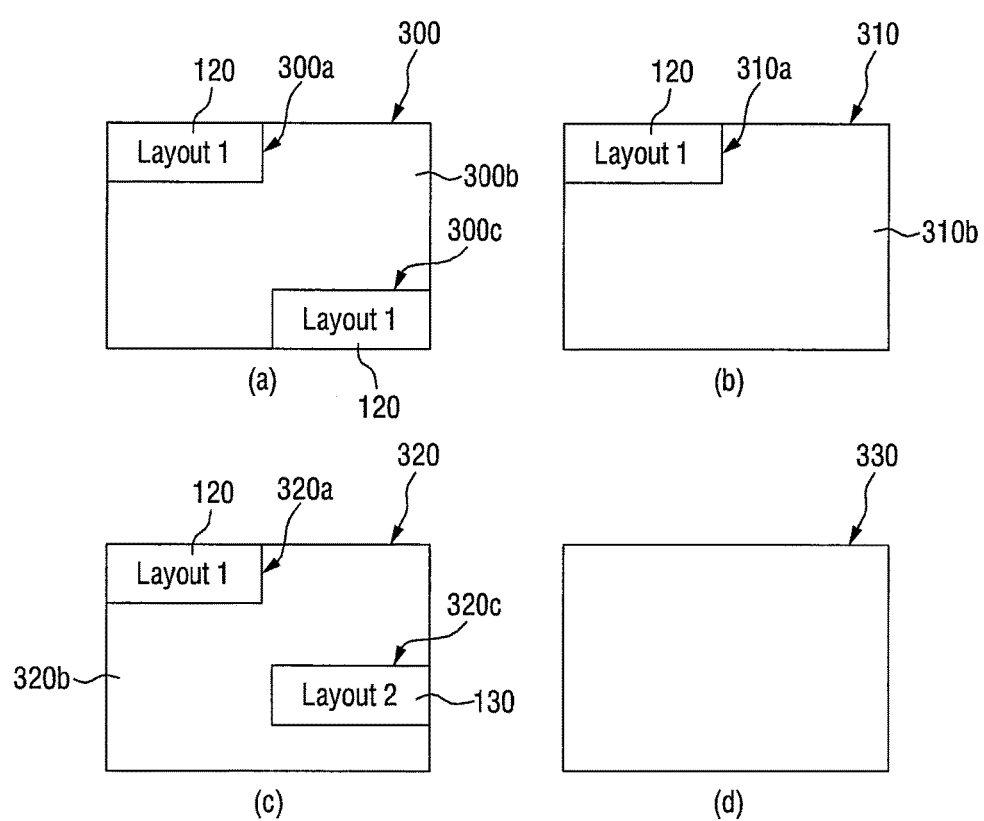

Referring to FIGS. 1, 5 and 6B, first to fourth standard cell layouts 300, 310, 320, and 330 are designed using the provided design rule and first and second data files 120*f* and 130*f*.

The method of designing the first standard cell layout 300 using the design rule and the first data file 120*f* will now be described with reference to FIG. 6B (a).

The first standard cell layout 300 may have a first region 300*a*, a second region 300*b* and a third region 300*c*.

In some embodiments of the present inventive concept, the second region 300*b* of the first standard cell layout 300 may be a region adjacent to the first region 300*a* of the first standard cell layout 300 and the third region 300*c* of the first standard cell layout 300. That is to say, the second region 300*b* of the first standard cell layout 300 may be positioned around the first region 300*a* of the first standard cell layout 300 and the third region 300*c* of the first standard cell layout 300.

In the illustrated embodiment, the first region 300*a* of the first standard cell layout 300 and the third region 300*c* of the first standard cell layout 300 may be regions of the first standard cell layout 300, which are different from each other.

The first region 300*a* of the first standard cell layout 300 may be designed using the first data file 120*f*. The designing of the first region 300*a* of the first standard cell layout 300 may include arranging the first region 300*a* of the first standard cell layout 300 on the first scaling enhanced circuit layout 120.

In other words, since the IC designer receives the first scaling enhanced circuit layout 120 in a graphic data format, the first scaling enhanced circuit layout 120 may be arranged on the first region 300*a* of the first standard cell layout 300 without an additional designing process.

The third region 300*c* of the first standard cell layout 300 may also be designed at the time of designing the first region 300*a* of the first standard cell layout 300. That is to say, the first scaling enhanced circuit layout 120 may be arranged on the third region 300*c* of the first standard cell layout 300.

Next, the second region 300*b* of the first standard cell layout 300 is designed using the design rule. In detail, the designing of the second region 300*b* of the first standard cell layout 300 may include designing a surrounding region of the first region 300*a* of the first standard cell layout 300 where the first scaling enhanced circuit layout 120 is arranged and the third region 300*c* of the first standard cell layout 300 using the design rule.

When the second region 300*b* of the first standard cell layout 300 is designed, surrounding patterns of the first scaling enhanced circuit layout 120 and the first standard cell layout 300 arranged on the first and third regions 300*a* and 300*c* of the first standard cell layout 300 may be taken into consideration.

Next, processes of designing the second standard cell layout 310, the third standard cell layout 320 and the fourth standard cell layout 330 performing different functions from the first standard cell layout 300 will now be described.

The first to fourth standard cell layouts 300, 310, 320, and 330 may be standard cell layouts performing different functions.

In FIG. 6B, four standard cell layouts 300, 310, 320 and 330 are illustrated, which is, however, provided only for the sake of brevity and convenient explanation, but aspects of the present disclosure are not limited thereto.

Further, FIG. 6B illustrates the standard cell layouts designed using first and second scaling enhanced circuit layouts 120 and 130 different from each other, which is, however, provided only for the sake of brevity and convenient explanation, but aspects of the present disclosure are not limited thereto.

As illustrated in FIG. 6B (b), the second standard cell layout 310 may have a first region 310*a* and a second region 310*b*. The second region 300*b* of the first standard cell layout 300 may be positioned around the first region 300*a* of the first standard cell layout 300. Unlike the first standard cell layout 300, the second standard cell layout 310 may include one single first scaling enhanced circuit layout 120.

As illustrated in FIGS. 6B (a) and 6B (b), the first standard cell layout 300 and the second standard cell layout 310 performing different functions may include the same scaling enhanced circuit layout, that is, the first scaling enhanced circuit layout 120.

The method of designing the third standard cell layout 320 using the design rule, the first data file 120*f* and the second data file 130*f* will now be described with reference to FIG. 6B (c).

The third standard cell layout 320 may have a first region 320*a*, a second region 320*b* and a third region 320*c*.

The second region 320*b* of the third standard cell layout 320 may be a region adjacent to the first region 320*a* of the third standard cell layout 320 and the third region 320*c* of the third standard cell layout 320. The second region 320*b* of the third standard cell layout 320 may be positioned around the third region 320*c* of the third standard cell layout 320 and around the third region 320*c* of the third standard cell layout 320.

The first region 320*a* of the third standard cell layout 320 may be designed using the first data file 120*f*. The designing of the first region 320*a* of the third standard cell layout 320 may include arranging the first scaling enhanced circuit layout 120 on the first region 320*a* of the third standard cell layout 320.

Alternatively, the third region 320*c* of the third standard cell layout 320 may be designed using the second data file 130*f*. The designing of the third region 320*c* of the third standard cell layout 320 may include arranging the second scaling enhanced circuit layout 130 on the third region 320*c* of the third standard cell layout 320.

Next, the second region 320*b* of the third standard cell layout 320 may be designed using the design rule. In detail, the designing of the second region 320*b* of the third standard cell layout 320 may include designing a surrounding region of the first region 320*a* of the third standard cell layout 320 where the first scaling enhanced circuit layout 120 is arranged and the third region 320*c* of the third standard cell layout 320 where the second scaling enhanced circuit layout 130 is arranged using the design rule.

When the second region 320*b* of the third standard cell layout 320 is designed, surrounding patterns of the first scaling enhanced circuit layout 120, the second scaling enhanced circuit layout 130 and the third standard cell layout 320 may be taken into consideration.

In FIG. 6B (d), the fourth standard cell layout 330 may not include a scaling enhanced circuit layout but may be generally designed using the design rule.

As described above, the designed first to fourth standard cell layouts 300, 310, 320, and 330 may be formed in graphic data formats. The designing method may be performed by, for example, the second entity (60 of FIG. 6A), such as an IC designer.

The first to fourth standard cell layouts 300, 310, 320, and 330 formed in graphic data formats may be provided to a logic block layout designer.

Although not shown in FIG. 1, the design rule with respect to each of the first to fourth standard cell layouts 300, 310, 320, and 330 may be checked using a design rule checker (DRC).

When the design rules of the first to fourth standard cell layouts 300, 310, 320, and 330 are checked, some portions of the standard cell layout where the first scaling enhanced circuit layout 120 and/or the second scaling enhanced circuit layout 130 are arranged may not be checked using the DRC.

Positions where the first scaling enhanced circuit layout 120 and/or the second scaling enhanced circuit layout 130 are arranged may be defined through marker layers included in the first scaling enhanced circuit layout 120 and/or second scaling enhanced circuit layout 130, and a verifier may easily identify the defined positions.

In some embodiments of the present inventive concept, when the design rules of the first to fourth standard cell layouts 300, 310, 320, and 330 are checked, some portions of the standard cell layout where the first scaling enhanced circuit layout 120 and/or the second scaling enhanced circuit layout 130 are arranged may be processed as being layouts satisfying the design rules.

When the design rules of the first to fourth standard cell layouts 300, 310, 320, and 330 are checked, a logic block layout to be described herein is designed and the DRC of the logic block layout may not be performed.

Figure 7:
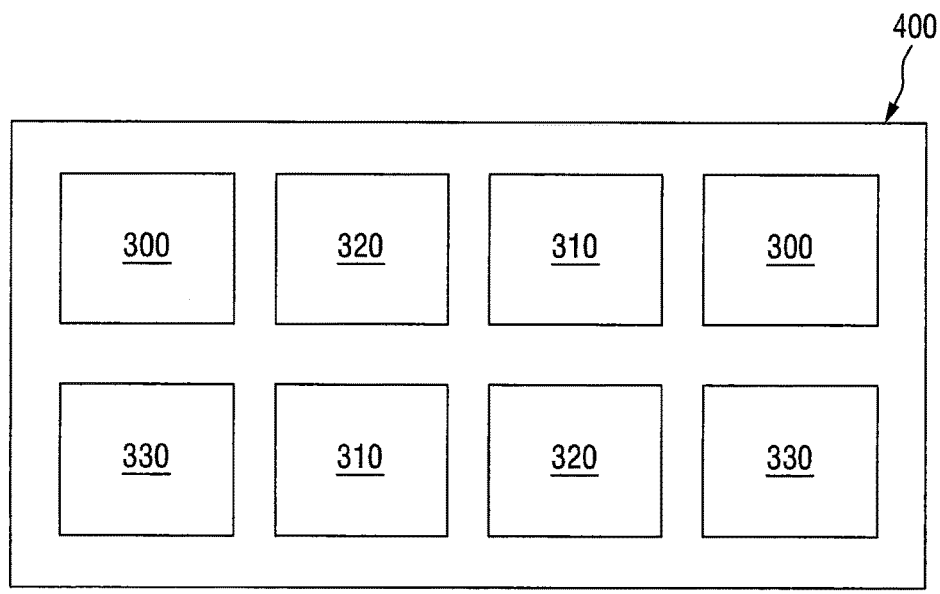

Next, referring to FIGS. 1, 6B and 7, the logic block layout 400 including the first to fourth standard cell layouts 300, 310, 320, and 330 is designed.

The logic block layout designer arranges the first to fourth standard cell layouts 300, 310, 320, and 330 in the logic block layout 400 so as to fabricate a logic integrated circuit to be implemented by the logic block layout 400.

At least one of the first to fourth standard cell layouts 300, 310, 320, and 330 may include the first scaling enhanced circuit layout 120 and/or the second scaling enhanced circuit layout 130.

Therefore, the logic block layout 400 may include the first scaling enhanced circuit layout 120 and/or the second scaling enhanced circuit layout 130. The first scaling enhanced circuit layout 120 and/or the second scaling enhanced circuit layout 130 may be arranged on some regions of the logic block layout 400.

The thus designed logic block layout 400 may be formed in a graphic data format. The designing method may be performed by, for example, the second entity (60 of FIG. 6A), such as an IC designer, but aspects of the present disclosure are not limited thereto. In some cases, the designing method may also be performed by, for example, the first entity (50 of FIG. 6A), such as an IC designer.

When the designing method is performed by, for example, the second entity (60 of FIG. 6A), such as an IC designer, the logic block layout 400 in the graphic data format may be provided to the first entity (50 of FIG. 6A), such as an IC designer.

In accordance with embodiments described with reference to FIG. 1, the design rule with respect to the logic block layout 400 may be checked using the DRC.

When the design rule of the logic block layout 400 is checked, some portions of the logic block layout 400 where the first scaling enhanced circuit layout 120 and/or the second scaling enhanced circuit layout 130 are arranged may not be checked using the DRC.

Alternatively, when the design rule of the logic block layout 400 is checked, some portions of the logic block layout 400 where the first scaling enhanced circuit layout 120 and/or the second scaling enhanced circuit layout 130 are arranged may be processed as being layouts satisfying the design rule.

Figure 8:
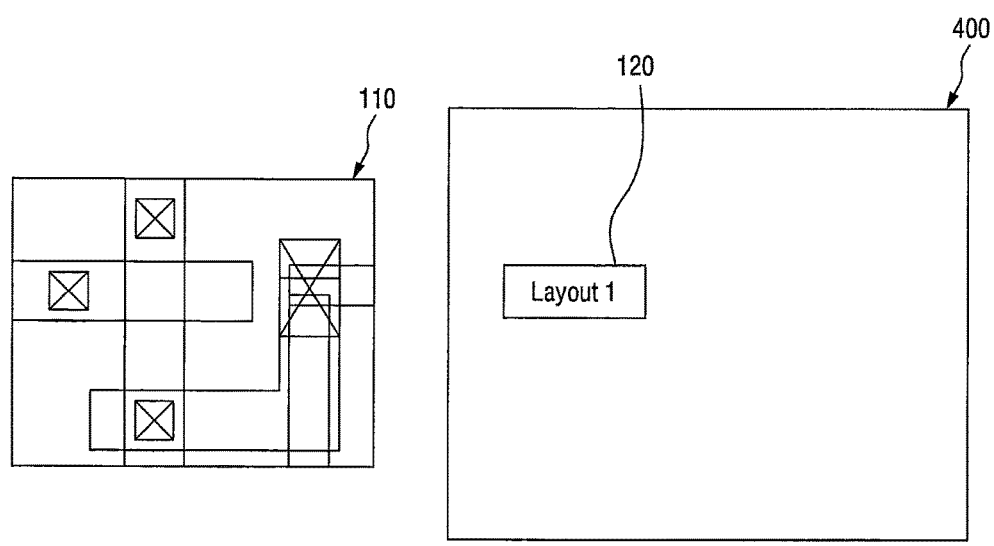

Next, referring to FIGS. 1 and 8, it may be checked whether the first scaling enhanced circuit layout 120 included in the logic block layout 400 is changed or not in designing the standard cell layouts 300, 310, 320, and 330 or designing the logic block layout 400.

The original of the first scaling enhanced circuit layout 120 included in the logic block layout 400 may be the golden scaling enhanced layout 110 described with reference to FIG. 4. That is to say, it may be confirmed whether the first scaling enhanced circuit layout 120 included in the logic block layout 400 is changed or not in the course of designing the standard cell layout or the logic block layout using the golden scaling enhanced layout 110.

The method of designing the first standard cell layout 300 illustrated in FIG. 6(b) will be described by way of example. The second region 300b of the first standard cell layout 300 is designed after the first scaling enhanced circuit layout 120 is arranged on the first region 300a of the first standard cell layout 300.

That is to say, the first scaling enhanced circuit layout 120 arranged on the first region 300a of the first standard cell layout 300 may be changed by a designer's intention or mistake in the course of designing the second region 300b of the first standard cell layout 300 using the design rule.

The first scaling enhanced circuit layout 120 is optimized with respect to fabrication process. When the first scaling enhanced circuit layout 120 is changed during the designing method and a photo mask is fabricated using the changed first scaling enhanced circuit layout, a logic IC formed using the photo mask may not properly operate as intended by the IC designer. Since the photo mask is fabricated using the changed first scaling enhanced circuit layout, the logic IC formed using the photo mask may also be changed.

The first scaling enhanced circuit layout 120 included in the logic block layout 400 is verified using the golden scaling enhanced layout 110, thereby securing process stability and performance of the logic IC formed by the logic block layout.

The verification may be performed by, for example, the first entity (50 of FIG. 6A), such as an IC designer.

The verification may be performed by, for example, a verification system, which is described in more detail with reference to FIG. 9.

Figure 9:
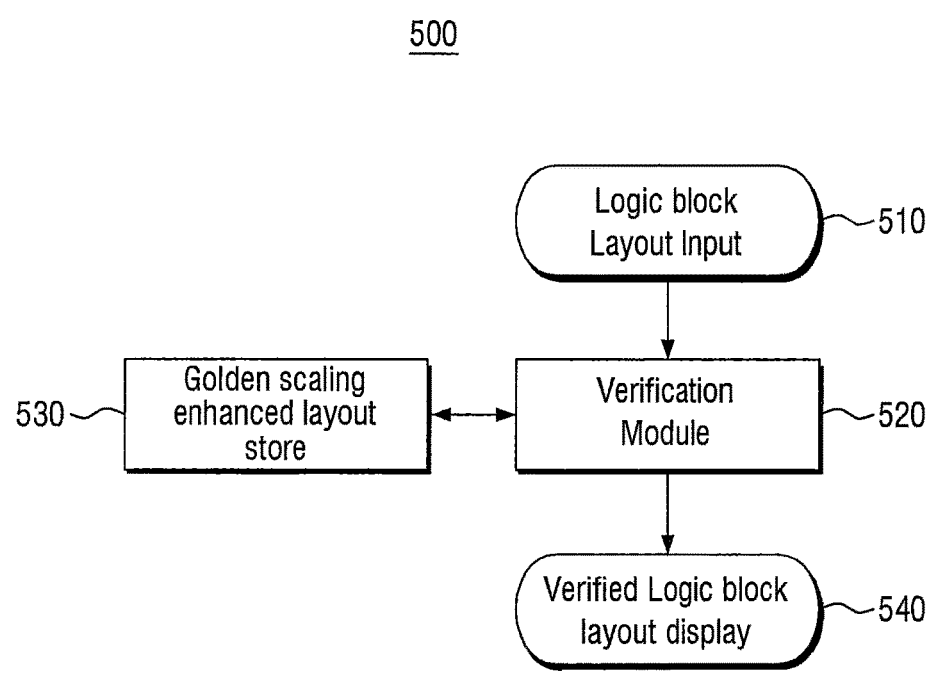
FIG. 9 is a block diagram of a system configured to process a semiconductor device design according to an embodiment of the present inventive concept.

FIG. 9 is a block diagram of a system for designing a semiconductor device according to an embodiment of the present inventive concept.

Referring to FIGS. 7 to 9, an integrated circuit (IC) verification system 500 verifying the designed logic block layout 400 may include a first input module 510, a first storage 530, a verification module 520, and a display 540.

The first input module 510 may receive the logic block layout 400 including the first scaling enhanced circuit layout 120. The first input module 510 may receive the logic block layout 400 in a graphic data format.

The first storage 530 is part in which the golden scaling enhanced layout 110, that is, the original of the first scaling enhanced circuit layout 120, is stored, which is, however, provided only for the sake of brevity and convenient explanation, but aspects of the present disclosure are not limited thereto. That is to say, a separate input module to receive the golden scaling enhanced layout 110, i.e., the original of the first scaling enhanced circuit layout 120, may be additionally provided.

The verification module 520 may compare the first scaling enhanced circuit layout 120 in the logic block layout 400 received in the first input module 510 with the golden scaling enhanced layout 110 of the first storage 530 and may determine whether the first scaling enhanced circuit layout 120 is changed or not during the designing process.

The verification module 520 may check with a marker layer included in the first scaling enhanced circuit layout 120 and may detect on which region of the logic block layout 400 the first scaling enhanced circuit layout 120 is arranged.

The display 540 may display whether the first scaling enhanced circuit layout 120 verified by the verification module 520 is changed or not.

Next, a method of designing a semiconductor device according to an embodiment of the present inventive concept is described with reference to FIGS. 10 to 13.

Figure 10:
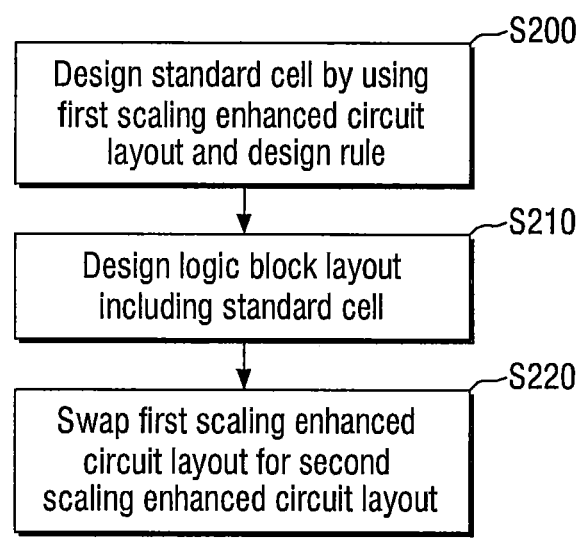
FIG. 10 is a flowchart illustrating a method of processing a semiconductor device design according to an embodiment of the present inventive concept.
Figure 11:
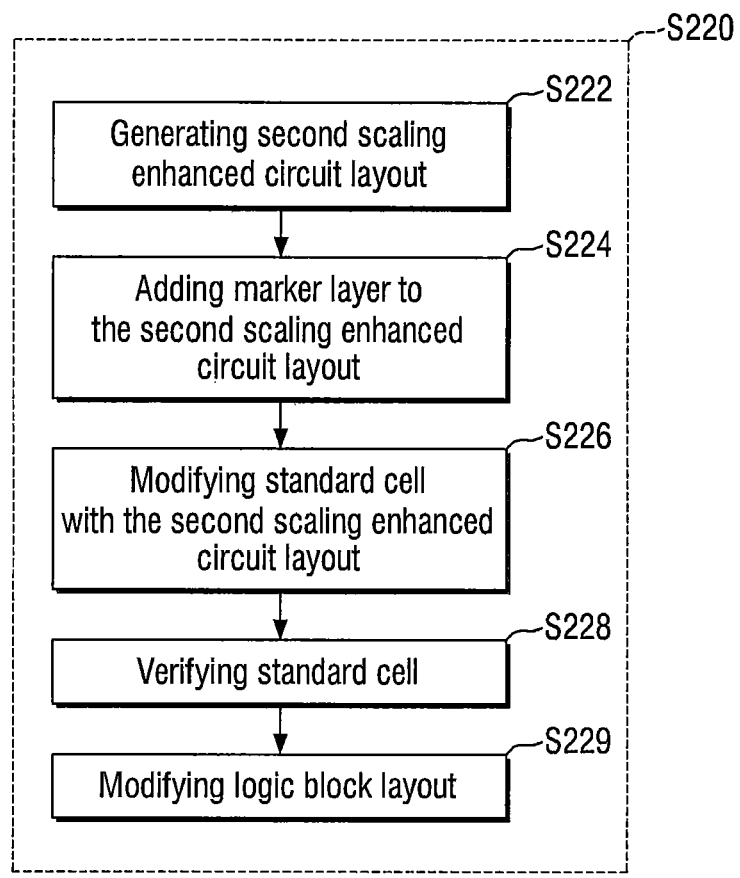
FIG. 11 is a detailed flowchart illustrating the step S220 of FIG. 10.
Figure 12:
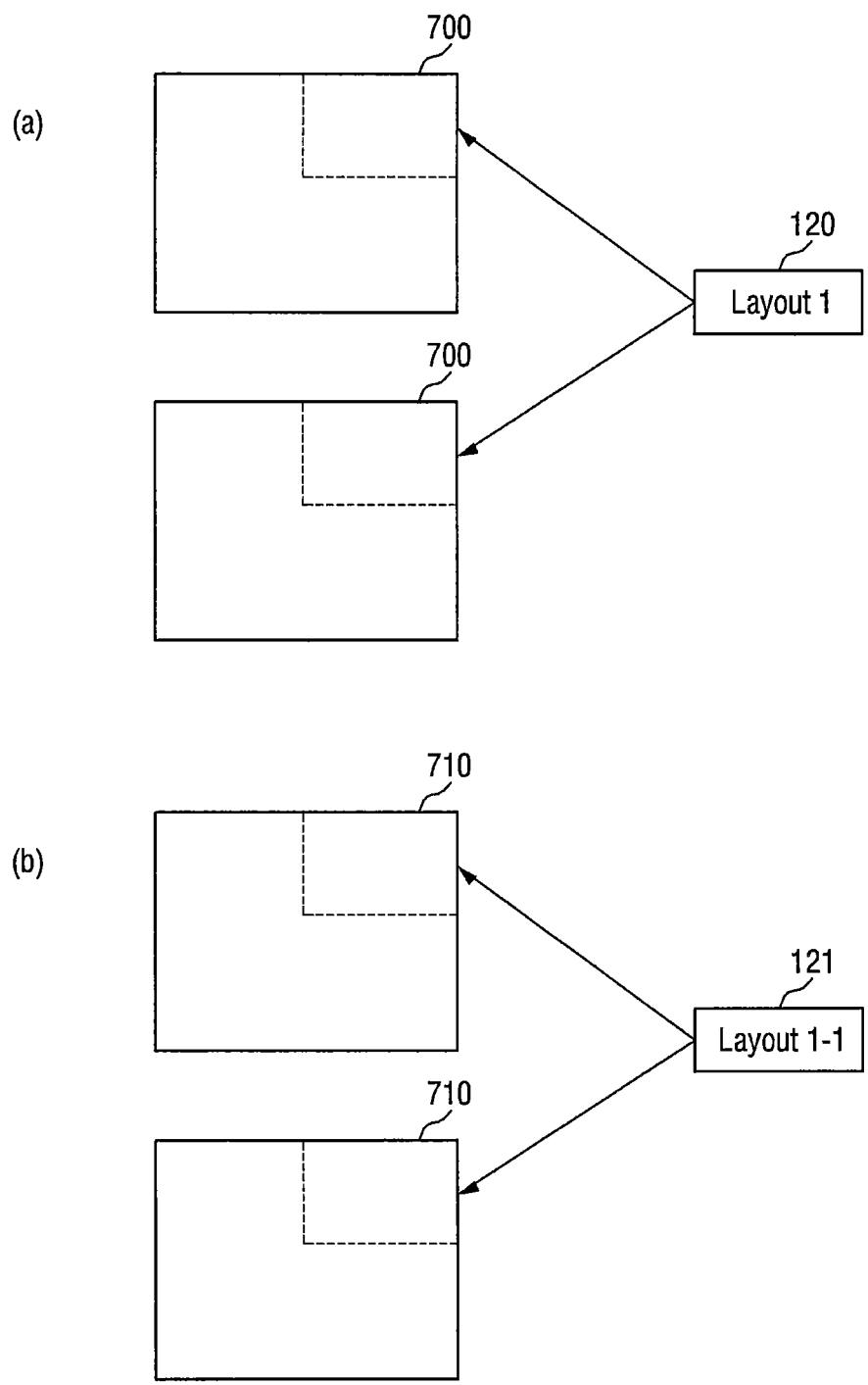
FIGS. 12 and 13 are diagrams illustrating the processing illustrated in FIG. 11.
Figure 13:
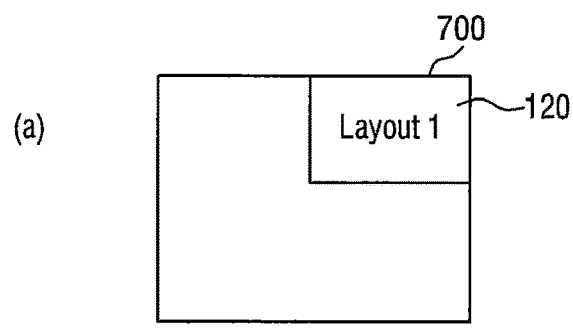
Figure 13:
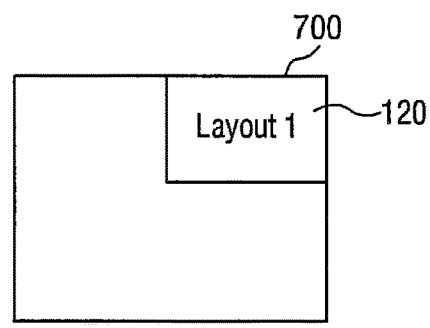
Figure 13:
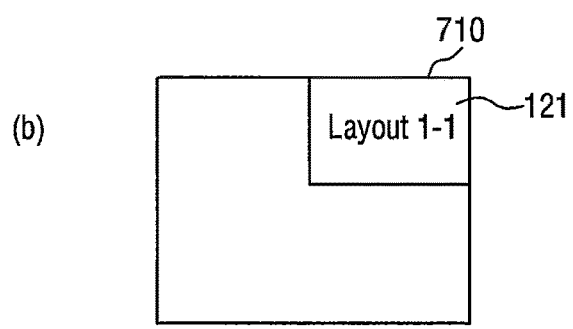
Figure 13:
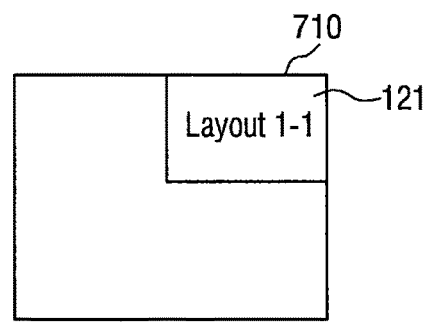

FIG. 10 is a flowchart illustrating a method of designing a semiconductor device according to another embodiment of the present inventive concept, FIG. 11 is a detailed flowchart illustrating the step S220 of FIG. 10, and FIGS. 12 and 13 are diagrams illustrating the methods illustrated in FIG. 11.

Referring to FIG. 10, a standard cell layout is designed using the scaling enhanced circuit layout and the design rule (S200).

The following description will be made with regard to a case of designing a second standard cell layout 310 including the first scaling enhanced circuit layout 120.

The second standard cell layout 310 may include the first scaling enhanced circuit layout 120. In addition, the first scaling enhanced circuit layout 120 may include a marker layer (115 of FIG. 4).

Referring again to FIG. 10, a logic block layout (for example, 400 of FIG. 7) including the second standard cell layout 310 is designed (S210). The steps S200 and S210 are the same as described above and detailed descriptions thereof will not be repeated.

Next, referring again to FIG. 10, the first scaling enhanced circuit layout in the logic block layout is swapped for the second scaling enhanced circuit layout (S220). In other words, the first scaling enhanced circuit layout in the logic block layout can be replaced with the second scaling enhanced circuit layout using the EDA tool, for example.

Hereinafter, the step of swapping of the first scaling enhanced circuit layout in the logic block layout after the designing of the logic block layout will be described. When necessary, the designing of the logic block layout may not be performed. In other words, this embodiment may be modified such that the first scaling enhanced circuit layout in the standard cell layout is swapped after the designing of the standard cell layout.

Referring to FIG. 11, first, the second scaling enhanced circuit layout is generated (S222).

For example, the second scaling enhanced circuit layout (121 of FIG. 12) may be designed by the method described above with reference to FIG. 2. When the process used in optimizing the first scaling enhanced circuit layout (120 of FIG. 12) is changed, the first scaling enhanced circuit layout (120 of FIG. 12) is updated in consideration of the changed process, thereby designing the second scaling enhanced circuit layout (121 of FIG. 12).

The second scaling enhanced circuit layout 121 may include the same design rule violation requiring region 105 as the first scaling enhanced circuit layout 120.

Next, a marker layer is added to the designed second scaling enhanced circuit layout (S224).

For example, the marker layer 115 illustrated in FIG. 4 may be formed in the second scaling enhanced circuit layout.

Next, the first scaling enhanced circuit layout is modified with the second scaling enhanced circuit layout (S226).

In some embodiments of the present inventive concept, as illustrated in FIGS. 12 and 13, the modifying may be performed on the level of, for example, standard cell layouts (700, 710 of FIGS. 12, 13).

Referring to FIG. 12, in some embodiments of the present inventive concept, when the scaling enhanced circuit layout is provided in a format of a GDS instance file, that is, when the first standard cell layouts 700 are designed so as to refer to the scaling enhanced circuit layout, the modifying may be performed such that the scaling enhanced circuit layout referred to by the first standard cell layouts 700 is modified.

For example, referring to 12(*a*), the first standard cell layouts 700 each referring to the first scaling enhanced circuit layout 120 may be provided. In this case, as shown in FIG. 12(*a*), the first standard cell layouts 700 may be designed so as to refer to the first scaling enhanced circuit layout 120 provided in a format of a GDS instance file. In other words, the first scaling enhanced circuit layout 120 may not be arranged on each of the first standard cell layouts 700 but may be designed to be referred to by each of the first standard cell layouts 700.

A region occupied by the first scaling enhanced circuit layout 120 in each of the first standard cell layouts 700 may be defined using, for example, the marker layer (115 of FIG. 4).

In this case, as illustrated in FIG. 12(*b*), the first scaling enhanced circuit layout 120 referred to by each of the first standard cell layouts 700 is modified with the second scaling enhanced circuit layout 121, thereby designing the second standard cell layouts 710 each including the second scaling enhanced circuit layout 121.

In other words, the first standard cell layouts 700 each including the first scaling enhanced circuit layout 120 may be modified with the second standard cell layouts 710 each including the second scaling enhanced circuit layout 121 by modifying only the GDS instance files referred to by the first standard cell layouts 700.

Referring to FIG. 13, in some other embodiments of the present inventive concept, when the scaling enhanced circuit layout is provided in a format of a GDS file, that is, when the scaling enhanced circuit layout is arranged on each of the first standard cell layouts 700, the modifying may be performed such that the scaling enhanced circuit layout arranged on each of the first standard cell layouts 700 is modified.

For example, referring to FIG. 13(*a*), the first standard cell layouts 700, on each of which a first scaling enhanced circuit layout (Layout 1) 120 is arranged, may be provided. In this case, as illustrated in FIG. 13(*a*), the first standard cell layouts 700 may be designed such that the first scaling enhanced circuit layout 120 provided in a format of a GDS file is arranged. In other words, the first scaling enhanced circuit layout 120 may not may be designed to be referred to by each of the first standard cell layouts 700 but may be arranged on each of the first standard cell layouts 700.

A region occupied by the first scaling enhanced circuit layout 120 in each of the first standard cell layouts 700 may be defined using, for example, the marker layer (115 of FIG. 4).

In this case, as illustrated in FIG. 13(*b*), the first scaling enhanced circuit layout 120 arranged on each of the first standard cell layouts 700 is modified with a second scaling enhanced circuit layout (Layout 1-1) 121, thereby designing the second standard cell layouts 710 each including the second scaling enhanced circuit layout 121.

In other words, the first scaling enhanced circuit layout 120 arranged on each of the first standard cell layouts 700 may be modified with the second scaling enhanced circuit layout 121 to then be arranged, thereby modifying the first standard cell layouts 700 with the second standard cell layouts 710.

Referring again to FIG. 11, the standard cell layout having the modified scaling enhanced circuit layout is verified (S228).

In detail, verification, which is required as the first standard cell layout 700 including the first scaling enhanced circuit layout 120 is modified with the second standard cell layout 710 including the second scaling enhanced circuit layout 121, may be performed.

If the verification is completed, the logic block layout may be modified using the second standard cell layout 710 including the second scaling enhanced circuit layout 121 (S229).

In some other embodiments of the present inventive concept, the modifying of the first scaling enhanced circuit layout with the second scaling enhanced circuit layout (S226) may be performed in the level of logic block layout, unlike in the previous embodiment.

Figure 14:
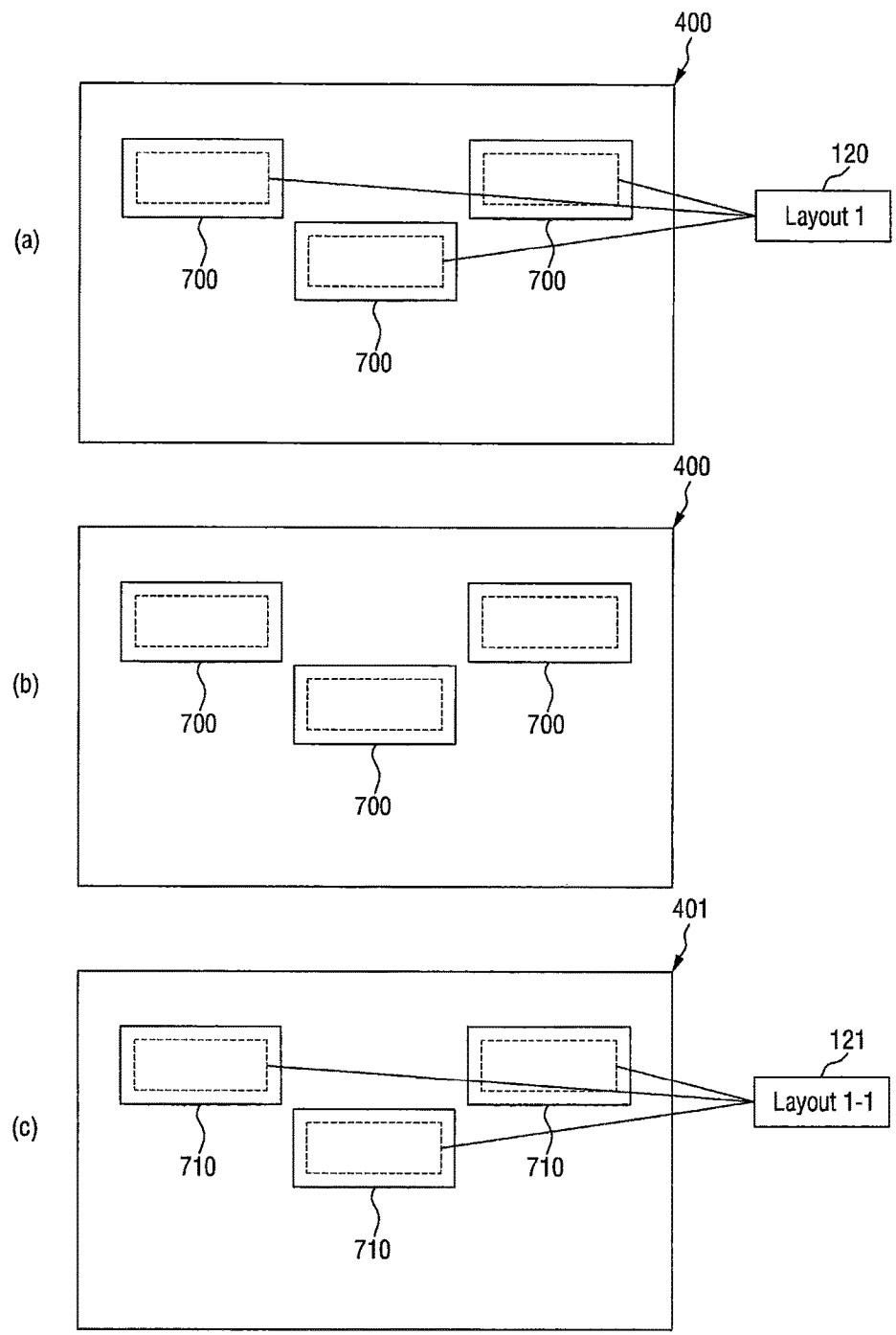
FIGS. 14 and 15 are diagrams illustrating processing of a semiconductor device design according to an embodiment of the present inventive concept.
Figure 15:
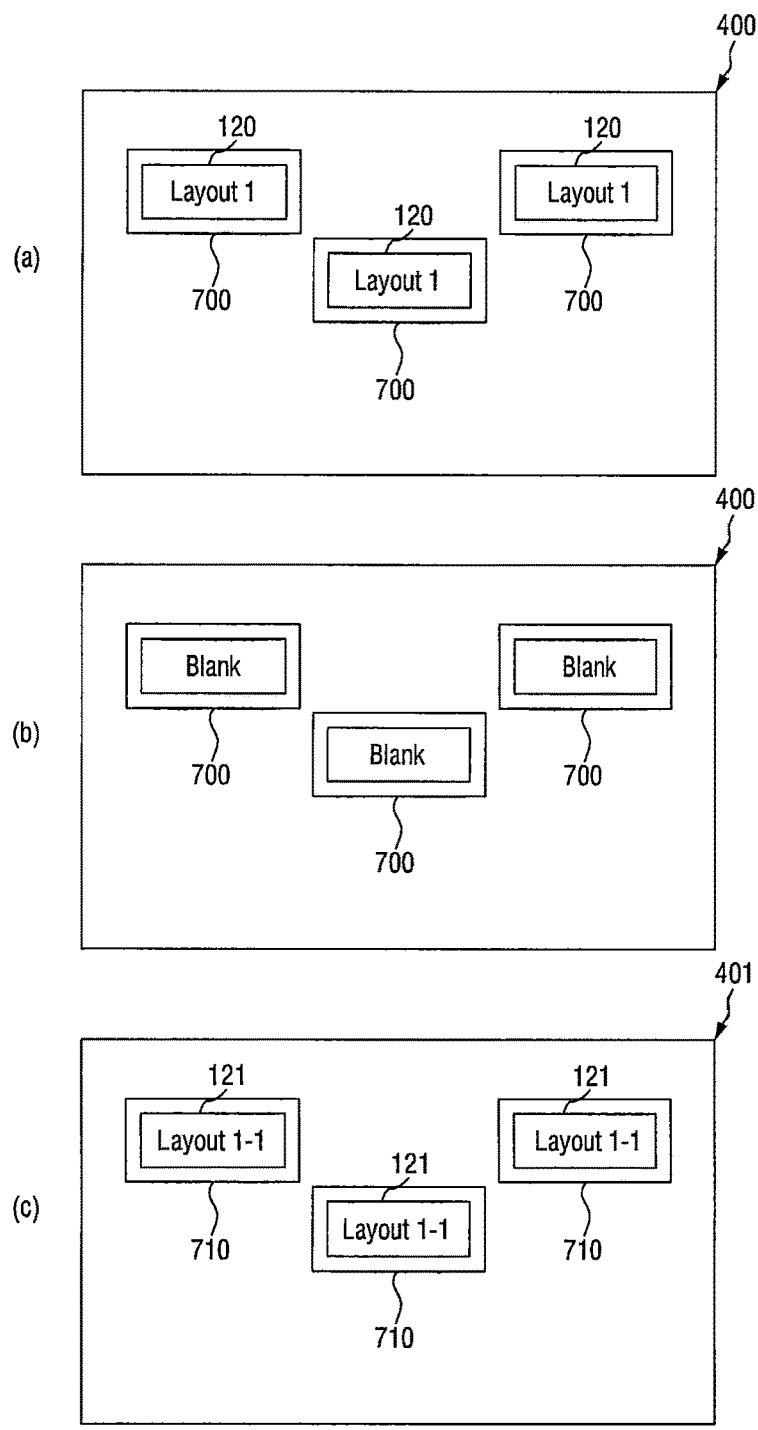

FIGS. 14 and 15 are diagrams illustrating a method of designing a semiconductor device according to still another embodiment of the present inventive concept.

First, referring to FIG. 14, the designing method will be described with regard to a case where the scaling enhanced circuit layout is provided in a format of a GDS instance file, that is, a case where the first standard cell layouts 700 are designed so as to refer to the scaling enhanced circuit layout.

In FIGS. 14(*a*) and (*b*), the first scaling enhanced circuit layout 120 referred to by each of the standard cell layouts 700 included in the logic block layout 400 is removed. As illustrated in FIGS. 14(*a*) and (*b*), a region of the logic block layout 400, resulting from the removing of the first scaling enhanced circuit layout 120, may be defined as a blank region because it is not referred to by any standard cell layout.

A region of the logic block layout 400, where the first scaling enhanced circuit layout 120 is defined, may be identified using the marker layer included in the first scaling enhanced circuit layout 120.

Next, in FIGS. 14(*b*) and (*c*), the respective standard cell layouts 700 included in the logic block layout 400 are modified so as to refer to the second scaling enhanced circuit layout 121.

In such a manner, the updated logic block layout 401 may be designed.

Next, referring to FIG. 15, the designing method will be described with regard to a case where the scaling enhanced circuit layout is provided in a format of a GDS file, that is, a case where the first standard cell layouts 700 are designed such that the scaling enhanced circuit layout is arranged on each of the first standard cell layouts 700.

In FIGS. 15(*a*) and (*b*), the first scaling enhanced circuit layout 120 arranged on each of the standard cell layouts 700 included in the logic block layout 400 is removed. As illustrated in FIGS. 15(*a*) and (*b*), a region of the logic block layout 400, resulting from the removing of the first scaling enhanced circuit layout 120, may be defined as a blank region.

A region of the logic block layout 400, where the first scaling enhanced circuit layout 120 is defined, may be identified using the marker layer included in the first scaling enhanced circuit layout 120.

Next, in FIGS. 15(*b*) and (*c*), the second scaling enhanced circuit layout 121 is arranged on each of the standard cell layouts 700 included in the logic block layout 400.

In such a manner, the updated logic block layout 401 may be designed.

As described above, in the method of designing the semiconductor devices according to embodiments of the present inventive concept, the scaling enhanced circuit layout is updated according to process variations, and the updated scaling enhanced circuit layout may be simply replaced with the existing scaling enhanced circuit layout, thereby designing again the standard cell layout or the logic block layout.

If the scaling enhanced circuit layout in a GDS file format is not used, quite a long time is required in updating the logic block layout. That is to say, the design rule manual is updated and a process design kit (PDK) is updated. Next, the standard cell layouts are updated using the updated PDK and the logic block layout is updated using the updated standard cell layouts.

The logic block layout is generally updated using the complicated procedure. According to the present inventive concept, however, the scaling enhanced circuit layout can be simply replaced using the IC designing method, thereby updating the logic block layout.

Figure 16:
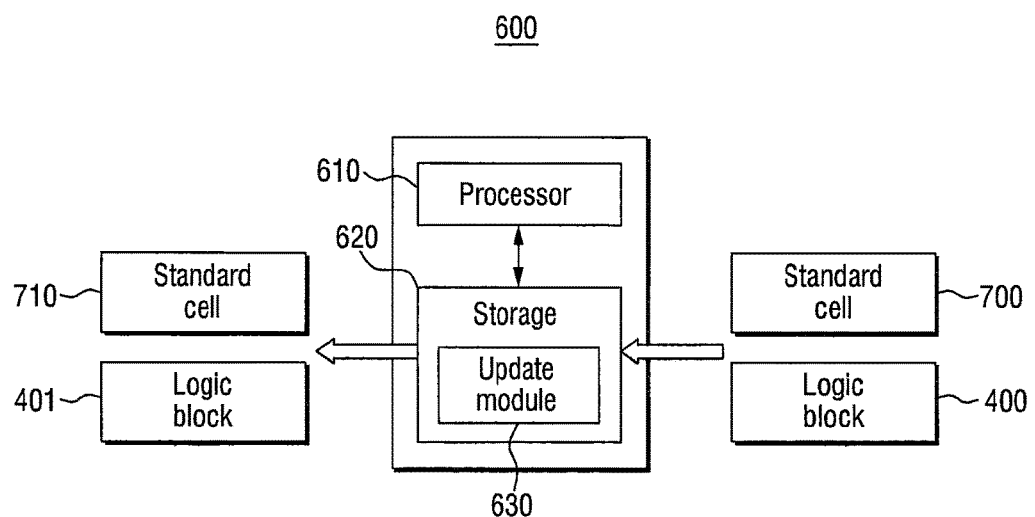
FIG. 16 is a block diagram of a system configured to process a semiconductor device design according to an embodiment of the present inventive concept.

FIG. 16 is a block diagram of a system for designing a semiconductor device according to still another embodiment of the present inventive concept.

Referring to FIG. 16, a verification system 600 may include a processor 610 and a storage 620.

The update module 630 may be stored in the storage 620. The update module 630 may perform swapping of the scaling enhanced circuit layout 120.

In detail, the update module 630 may generate second standard cell layouts 710 or a second logic block layout 401 by swapping first standard cell layouts 700 or a scaling enhanced circuit layout included in the first logic block layout 400.

Here, the first standard cell layouts 700 or the scaling enhanced circuit layout included in the first logic block layout 400 may be defined by the marker layer (115 of FIG. 4).

The processor 610 may be used when the update module 630 performs the above-described operation.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed:

1. A method of manufacturing an electronic circuit, the method comprising:
electronically providing data representing a first standard cell layout including a first scaling enhanced circuit layout in an electronic storage medium;
electronically defining the first scaling enhanced circuit layout included in the first standard cell layout using a marker layer;
electronically swapping the first scaling enhanced circuit layout for a second scaling enhanced circuit layout to electronically generate data representing a second standard cell layout in the electronic storage medium;
electronically verifying the data representing the second standard cell layout using positions defined by the marker layer; and
using the data representing the second standard cell layout to pattern devices and interconnections of the electronic circuit on a semiconductor wafer, so that the electronic circuit includes the second standard cell layout.

2. The method of claim 1, wherein the first standard cell layout includes a third standard cell layout having a first region referring to the first scaling enhanced circuit layout, a fourth standard cell layout having a second region referring to the first scaling enhanced circuit layout; and
wherein electronically swapping comprises electronically swapping the first scaling enhanced circuit layout referred to by the first and second regions for the second scaling enhanced circuit layout.

3. The method of claim 1, wherein the first standard cell layout includes a third standard cell layout having a first region in which the first scaling enhanced circuit layout is arranged, a fourth standard cell layout having a second region in which the first scaling enhanced circuit layout is arranged; and
wherein electronically swapping comprises:
electronically swapping the first scaling enhanced circuit layout arranged in the third standard cell layout for the second scaling enhanced circuit layout, and
electronically swapping the first scaling enhanced circuit layout arranged in the fourth standard cell layout for the second scaling enhanced circuit layout.

4. The method of claim 1, further comprising:
electronically updating data representing a logic block layout using the second standard cell layout.

5. The method of claim 4, wherein electronically updating comprises electronically removing the first scaling enhanced circuit layout from the logic block layout; and then
electronically placing the second scaling enhanced circuit layout in a place from which the first scaling enhanced circuit layout was electronically removed.

6. The method of claim 1, wherein the second standard cell layout has a first region and a second region positioned adjacent to the first region, wherein electronically swapping further comprises:
electronically swapping the first scaling enhanced circuit layout in the first region of the second standard cell layout for the second scaling enhanced circuit layout; and
electronically generating the second region of the second standard cell layout using a design rule.

7. The method of claim 6, wherein the second scaling enhanced circuit layout is provided in a graphic database system (GDS) file, a GDS instance file and/or a hard macro file.

8. The method of claim 1, wherein the first standard cell layout has a first region and a second region positioned to be adjacent to the first region, wherein the first scaling enhanced circuit layout includes a design rule violation layer in the first region, and data representing a circuit layout in accordance with a design rule is in the second region.

9. The method of claim 1, wherein the electronically verifying of the data representing the second standard cell layout comprises electronically verifying the second scaling enhanced circuit layout of the data representing the second standard cell layout using a golden scaling enhanced layout.

10. A method of manufacturing an electronic circuit, the method comprising:
electronically providing data representing a second scaling enhanced circuit layout including a second design rule violation layer in an electronic storage medium;
electronically providing data representing a first standard cell layout including a first scaling enhanced circuit layout that is different from the second scaling enhanced circuit layout and including a first design rule violation layer in the electronic storage medium;
electronically swapping the first scaling enhanced circuit layout for the second scaling enhanced circuit layout to electronically generate a second standard cell layout;

electronically verifying the second standard cell layout; and using the data representing the second standard cell layout to pattern devices and interconnections of the electronic circuit on a semiconductor wafer, so that the electronic circuit includes the second standard cell layout.

11. The method of claim 10, further comprising:

electronically defining the first scaling enhanced circuit layout included in the first standard cell layout using a marker layer.

12. The method of claim 10, wherein the first standard cell layout has a first region and a second region positioned adjacent to the first region, the first scaling enhanced circuit layout is arranged in the first region, and a circuit layout in accordance with a design rule is arranged in the second region.

13. The method of claim 12, wherein electronically swapping further comprises:

electronically swapping the first scaling enhanced circuit layout arranged in the first region of the first standard cell layout for the second scaling enhanced circuit layout.

14. A method of manufacturing a semiconductor device, the method comprising:

electronically providing data representing a first logic block layout including at least one first standard cell layout in an electronic storage medium, the first standard cell layout comprising a first scaling enhanced circuit layout; and electronically swapping the first scaling enhanced circuit layout for a second scaling enhanced circuit layout in the at least one first standard cell layout to produce at least one second standard cell layout in data representing a second logic block layout;

electronically verifying the second logic block layout by checking whether the second logic block layout is in conformity with a design rule, the checking excluding the second scaling enhanced circuit layout of the at least one second standard cell layout in the second logic block layout; and using the data representing the second logic block layout to pattern devices and interconnections of an electronic circuit on a semiconductor wafer, so that the electronic circuit includes the at least one second standard cell layout.

\* \* \* \* \*